United States Patent
Ganzel

(10) Patent No.: US 12,043,228 B2
(45) Date of Patent: Jul. 23, 2024

(54) APPARATUS AND METHOD FOR CONTROL OF A HYDRAULIC BRAKE SYSTEM

(71) Applicant: ZF Active Safety US Inc., Livonia, MI (US)

(72) Inventor: Blaise Joseph Ganzel, Ann Arbor, MI (US)

(73) Assignee: ZF Active Safety US Inc., Livonia, MI (US)

( * ) Notice: Subject to any disclaimer, the term of this patent is extended or adjusted under 35 U.S.C. 154(b) by 380 days.

(21) Appl. No.: 17/188,288

(22) Filed: Mar. 1, 2021

(65) Prior Publication Data

US 2022/0274576 A1 Sep. 1, 2022

(51) Int. Cl.
*B60T 13/74* (2006.01)
*B60T 7/04* (2006.01)
(Continued)

(52) U.S. Cl.
CPC ............ *B60T 13/588* (2013.01); *B60T 7/042* (2013.01); *B60T 8/17* (2013.01); *B60T 8/176* (2013.01);
(Continued)

(58) Field of Classification Search
CPC .. B60T 13/686; B60T 13/745; B60T 2270/82; B60T 8/4081; B60T 8/4086; B60T 8/409; B60T 13/588; B60T 13/148; B60T 13/746; B60T 8/17; B60T 8/176; B60T 15/028; B60T 17/221; B60T 2270/10; B60T 2270/402; B60T 2270/404; B60T 2270/406; B60T 7/042; H02K 11/215; H02K 7/10; H02K 7/1432

See application file for complete search history.

(56) References Cited

U.S. PATENT DOCUMENTS 10,730,501 B2    8/2020   Ganzel
10,960,865 B2 *   3/2021   Feigel ................... B60T 13/745
(Continued)

FOREIGN PATENT DOCUMENTS

| DE | 102013017688 A1 | 4/2014 |
|---|---|---|
| DE | 102017003650 A1 | 10/2018 |
| DE | 102018207771 A1 | 2/2019 |

OTHER PUBLICATIONS

German Search Report for corresponding German Application Serial No. 10 2022 201 771.4, dated Oct. 5, 2022, pp. 1-12.

*Primary Examiner* — Bradley T King
(74) *Attorney, Agent, or Firm* — Kristin L. Murphy

(57) ABSTRACT

A brake system for actuating a pair of front wheel brakes and a pair of rear wheel brakes includes a reservoir and a deceleration signal transmitter. First and second power transmission units are configured for selectively providing pressurized hydraulic fluid during a braking event. The first power transmission unit actuates a selected one of the front wheel brakes and a selected one of the rear wheel brakes. The second power transmission unit actuates the other one of the front wheel brakes and the other one of the rear wheel brakes. First and second electronic control units control the first and second power transmission units. A pair of rear brake motors selectively electrically actuate rear wheel brakes. Multiplex control of each of the pairs of front and rear wheel brakes is provided by an arrangement of first and second parallel valves for each wheel brake.

11 Claims, 8 Drawing Sheets

(51) Int. Cl.
*B60T 8/17* (2006.01)
*B60T 8/176* (2006.01)
*B60T 13/14* (2006.01)
*B60T 13/58* (2006.01)
*B60T 13/68* (2006.01)
*B60T 15/02* (2006.01)
*B60T 17/22* (2006.01)
*G05D 16/20* (2006.01)
*H02K 7/10* (2006.01)
*H02K 11/215* (2016.01)
*H05K 7/14* (2006.01)

(52) U.S. Cl.
CPC .......... *B60T 13/148* (2013.01); *B60T 13/686* (2013.01); *B60T 13/746* (2013.01); *B60T 15/028* (2013.01); *B60T 17/221* (2013.01); *G05D 16/204* (2013.01); *H02K 7/10* (2013.01); *H02K 11/215* (2016.01); *H05K 7/1432* (2013.01); *B60T 2270/10* (2013.01); *B60T 2270/402* (2013.01); *B60T 2270/404* (2013.01); *B60T 2270/406* (2013.01); *B60T 2270/82* (2013.01)

(56) References Cited

U.S. PATENT DOCUMENTS

| | | | | |
|---|---|---|---|---|
| 2012/0160043 A1* | 6/2012 | Drumm | ................... | H02K 7/06 74/89.23 |
| 2014/0131154 A1* | 5/2014 | Ganzel | ................. | B60T 13/588 303/14 |
| 2014/0265544 A1* | 9/2014 | Ganzel | ................... | B60T 13/662 303/6.01 |
| 2014/0265547 A1* | 9/2014 | Ganzel | ................... | B60T 13/745 303/66 |
| 2015/0028667 A1* | 1/2015 | Leiber | ................... | B60T 11/103 303/15 |
| 2016/0016571 A1* | 1/2016 | Ganzel | ................... | B60T 7/042 303/66 |
| 2016/0200307 A1* | 7/2016 | Feigel | ................... | B60T 13/686 303/6.01 |
| 2016/0207514 A1* | 7/2016 | Knechtges | .............. | B60T 7/042 |
| 2016/0229383 A1* | 8/2016 | Leiber | ................... | B60T 13/745 |
| 2018/0009425 A1* | 1/2018 | Feigel | ................... | B60T 13/145 |
| 2018/0334149 A1* | 11/2018 | Feigel | ................... | B60T 13/148 |
| 2019/0031165 A1* | 1/2019 | Besier | ...................... | B60T 8/92 |
| 2019/0248348 A1* | 8/2019 | Ganzel | ................... | B60T 13/745 |
| 2020/0047731 A1* | 2/2020 | Reuter | ................... | B60T 13/146 |
| 2020/0307538 A1 | 10/2020 | Ganzel | | |
| 2020/0362888 A1* | 11/2020 | Leiber | ................... | B60T 15/36 |
| 2021/0122349 A1* | 4/2021 | Leiber | ................... | B60T 7/042 |
| 2021/0179051 A1* | 6/2021 | Alford | ................... | B60T 13/142 |
| 2022/0105914 A1* | 4/2022 | Leiber | ................... | B60T 13/662 |
| 2022/0274575 A1* | 9/2022 | Ganzel | ................... | B60T 7/042 |
| 2023/0048177 A1* | 2/2023 | Ganzel | ................... | B60T 13/146 |
| 2023/0048447 A1* | 2/2023 | Ganzel | ................... | B60T 17/22 |

* cited by examiner

APPARATUS AND METHOD FOR CONTROL OF A HYDRAULIC BRAKE SYSTEM

TECHNICAL FIELD

This disclosure relates to an apparatus and method for control of a hydraulic brake system and, more particularly, to a method and apparatus of providing remote electrical control of each wheel brake in a brake system.

BACKGROUND

A brake system may include anti-lock control including a pedal-operated hydraulic braking pressure generator, a braking pressure modulator which is provided in the pressure fluid conduits between the braking pressure generator and the wheel brakes and which serves to vary the braking pressure by changing the volume of a chamber containing the hydraulic fluid, sensors for determining the wheel rotational behavior, and electronic circuits for processing the sensor signals and for generating braking-pressure control signals. Brake systems may also include both anti-lock control and traction slip control, which can use braking pressure modulators for controlled vehicular braking.

Descriptions of prior art brake systems are in U.S. Pat. No. 10,730,501, issued 4 Aug. 2020 to Blaise Ganzel and titled "Vehicle Brake System with Auxiliary Pressure Source", and in U.S. Patent Application Publication No. 2020/0307538, published 1 Oct. 2020 by Blaise Ganzel and titled "Brake System with Multiple Pressure Sources", both of which are incorporated herein by reference in their entirety for all purposes.

SUMMARY

In an aspect, a brake system for actuating a pair of front wheel brakes and a pair of rear wheel brakes is described. The brake system includes a reservoir and a deceleration signal transmitter operable by actuation of a brake pedal connected to the deceleration signal transmitter to generate a brake actuating signal at a first output. First and second power transmission units are configured for selectively providing pressurized hydraulic fluid for actuating the pair of front wheel brakes and the pair of rear wheel brakes during a braking event. The first power transmission unit actuates a selected one of the front wheel brakes and a selected one of the rear wheel brakes. The second power transmission unit actuates the other one of the front wheel brakes and the other one of the rear wheel brakes. First and second electronic control units control the first and second power transmission units, respectively. A pair of rear brake motors selectively electrically actuate respective rear wheel parking brakes. Each rear brake motor is controlled by a selected one of the first and second electronic control units other than the first or second electronic control unit that controls the rear wheel brake associated with the same respective rear wheel parking brake. Multiplex control of each of the pair of front wheel brakes and the pair of rear wheel brakes is provided by an arrangement of first and second parallel valves for each wheel brake, with a chosen one of the first and second parallel valves receiving input from an output of the other one of the first and second parallel valves. The first and second parallel valves for the selected front and rear wheel brakes are actuated by the first power transmission unit and the first and second parallel valves for the other front and rear wheel brakes are actuated by the second power transmission unit.

In an aspect, a brake system for actuating a pair of front wheel brakes and a pair of rear wheel brakes is described. The brake system includes a reservoir and first and second power transmission units configured for selectively providing pressurized hydraulic fluid for actuating the pair of front wheel brakes during a braking event. The first power transmission unit actuates a selected one of the front wheel brakes and the second power transmission unit actuates the other one of the front wheel brakes. A deceleration signal transmitter is operable by actuation of a brake pedal connected thereto. The brake pedal and deceleration signal transmitter are hydraulically isolated from at least the reservoir and first and second power transmission units. The brake actuating signal is conveyed to at least one of the first and second power transmission units solely as an electronic signal from a first output. First and second control valves are provided. Each control valve is located hydraulically interposed between a corresponding first or second power transmission unit and the reservoir. The first and second control valves each are selectively operable to substantially block fluid flow to and from the reservoir and the corresponding first or second power transmission unit to facilitate retraction of a caliper of at least one of the wheel brakes actuated by the corresponding first or second power transmission unit for diagnostic purposes. First and second electronic control units control the first and second power transmission units, respectively. A pair of rear brake motors selectively electrically actuates respective rear wheel brakes. Each rear brake motor is controlled by a corresponding one of the first and second electronic control units that controls the contralateral front wheel brake.

In an aspect, a brake system for actuating a pair of front wheel brakes and a pair of rear wheel brakes is described. The brake system includes a reservoir and a power transmission unit configured for selectively providing pressurized hydraulic fluid for actuating the pair of front wheel brakes during a braking event. An electronic control unit controls the power transmission unit. A deceleration signal transmitter is operable by actuation of a brake pedal connected thereto. The brake pedal and deceleration signal transmitter are hydraulically isolated from at least the reservoir and the power transmission unit. The brake actuating signal is conveyed to the power transmission unit solely as an electronic signal from a first output. A pair of rear brake motors selectively electrically actuate respective rear wheel brakes. Multiplex control of each of the pair of front wheel brakes is provided by an arrangement of first and second parallel valves for each wheel brake, with a chosen one of the first and second parallel valves receiving input from an output of the other one of the first and second parallel valves. The arrangements of the first and second parallel valves for the pair of front wheel brakes are actuated by the power transmission unit.

BRIEF DESCRIPTION OF THE DRAWINGS

For a better understanding, reference may be made to the accompanying drawings, in which.

DESCRIPTION OF ASPECTS OF THE DISCLOSURE

Unless defined otherwise, all technical and scientific terms used herein have the same meaning as is commonly understood by one of ordinary skill in the art to which the present disclosure pertains.

The invention comprises, consists of, or consists essentially of the following features, in any combination.

Figure 1:
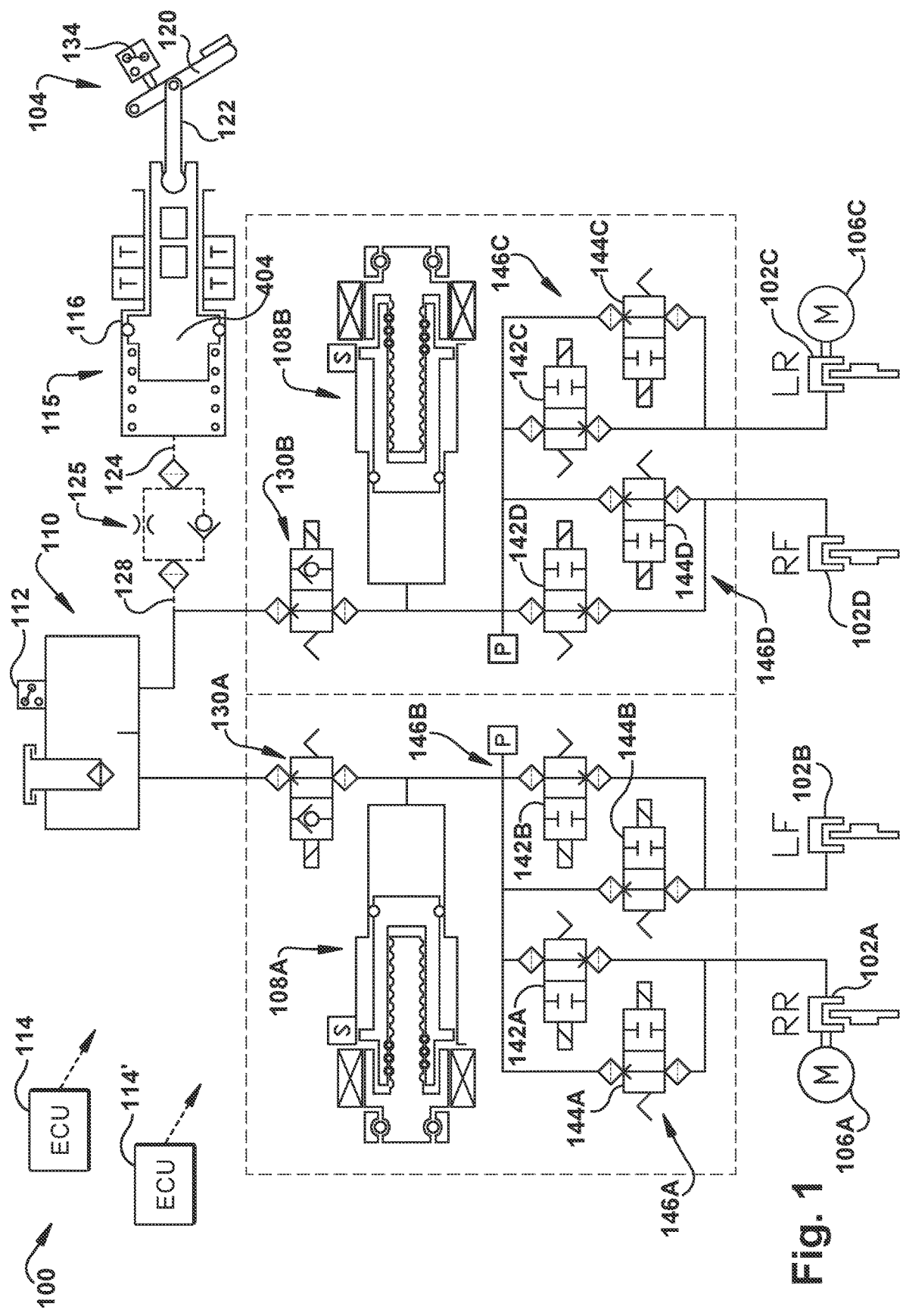
FIG. 1 is a schematic hydraulic diagram of a brake system according to an aspect of the present invention, in a first configuration.

FIG. 1 depicts a brake system 100 for actuating a pair of front wheel brakes and a pair of rear wheel brakes, in a first configuration. The brake system 100 is shown here as a hydraulic boost braking system in which boosted fluid pressure is utilized to apply braking forces for the brake system 100. The brake system 100 may suitably be used on a ground vehicle, such as an automotive vehicle having four wheels with a wheel brake associated with each wheel. Furthermore, the brake system 100 can be provided with other braking functions such as anti-lock braking (ABS) and other slip control features to effectively brake the vehicle. Components of the brake system 100 may be housed in one or more blocks or housings. The block or housing may be made from solid material, such as aluminum, that has been drilled, machined, or otherwise formed to house the various components. Fluid conduits may also be formed in the block or housing.

In the illustrated embodiment of the brake system 100, there are four wheel brakes 102A, 102B, 102C, and 102D. The wheel brakes 102A, 102B, 102C, and 102D can have any suitable wheel brake structure operated electrically and/or by the application of pressurized brake fluid. Each of the wheel brakes 102A, 102B, 102C, and 102D may include, for example, a brake caliper mounted on the vehicle to engage a frictional element (such as a brake disc) that rotates with a vehicle wheel to effect braking of the associated vehicle wheel. The wheel brakes 102A, 102B, 102C, and 102D can be associated with any combination of front and rear wheels of the vehicle in which the brake system 100 is installed. For example, the brake system 100 may be configured as a diagonal split system, as shown, such that a first brake pressure circuit (generally indicated by the leftmost dashed-line box, in FIG. 1) is associated with providing fluid to the right rear wheel brake 102A and the left front wheel brake 102B. A second brake pressure circuit (generally indicated by the rightmost dashed-line box, in FIG. 1) may be associated with providing fluid to the left rear wheel brake 102C and the right front wheel brake 102D, when the rear wheel brakes 102A and 102C are hydraulically operated. The front and/or rear wheel brakes may also or instead include an electric component, such as the rear brake motors 106A and 106C, shown and described herein, for selectively actuating respective rear wheel brakes. The combination of the rear brake motors 106A and 106C with a respective rear wheel brake may be considered to be an electro-mechanical brake, having the fast response needed for normal brake operation as compared to an electric parking brake. (The electric parking brakes may be relatively low-powered motors, compared to those needed to stop the vehicle, since they are intended to be used to maintain a parked position of an already-stopped vehicle and/or for added braking capability in a failed system condition.)

As referenced herein, the wheel brake 102A may be associated with a right rear wheel of the vehicle in which the brake system 100 is installed, and the wheel brake 102B may be associated with the left front wheel. The wheel brake 102C may be associated with the left rear wheel, and the wheel brake 102D may be associated with the right front wheel. Alternatively, though not depicted here, the brake system 100 may be configured as a vertical split brake system such that the wheel brakes 102A and 102B are associated with wheels at the front or rear axle of the vehicle, and the wheel brakes 102C and 102D are associated with wheels at the other axle of the vehicle.

The brake system 100 generally includes a brake pedal unit, indicated generally at 104, at least one power transmission unit (also known as a single acting plunger or a plunger assembly in some configurations), indicated generally at 108, and a fluid reservoir 110. The reservoir 110 stores and holds hydraulic fluid for the brake system 100. The fluid within the reservoir 110 is preferably held at or about atmospheric pressure, but the fluid may be stored at other pressures if desired. The reservoir 110 is shown schematically having two tanks or sections with fluid conduit lines connected thereto. The sections can be separated by several interior walls within the reservoir 110 and are provided to prevent complete drainage of the reservoir 110 in case one of the sections is depleted due to a leakage via one of the two lines connected to the reservoir 110. Alternatively, the reservoir 110 may include multiple separate housings. The reservoir 110 may include at least one fluid level sensor 112 for detecting the fluid level of one or more of the sections of the reservoir 110.

At least one power transmission unit 108 of the brake system 100 functions as a source of pressure to selectively provide a desired level of pressurized hydraulic fluid for actuating the hydraulically operated ones of the wheel brakes 102A, 102B, 102C, and 102D during a typical or non-failure normal brake apply or event. After a brake apply, fluid from the hydraulically operated ones of the wheel brakes 102A, 102B, 102C, and 102D may be returned to the power transmission unit 108 and/or diverted to the reservoir 110. In the depicted embodiment, first and second power transmission units are provided numbered 108A and 108B, with each of the first and second power transmission units 108A and 108B associated with a respective one of the first and second brake pressure circuits. More specifically in the diagonal brake system 100 shown in FIG. 1, the first power transmission unit 108A actuates a selected one of the front wheel brakes 102B and 102D and a selected one of the rear wheel brakes 102A and 102C, and the second power transmission unit 108B actuates the other one of the front wheel brakes 102B and 102D and the other one of the rear wheel brakes 102A and 102C.

The brake system 100 also includes at least one electronic control unit ("ECU") 114, with first and second electronic control units 114 and 114' shown schematically in FIG. 1. Each ECU 114 may include microprocessors and other electrical circuitry. Each ECU 114 receives various signals, processes signals, and controls the operation of various electrical components of the brake system 100 in response to the received signals. Each ECU 114 can be connected to various sensors such as the reservoir fluid level sensor 112, pressure sensors, travel sensors, switches, wheel speed sensors, and steering angle sensors. Each ECU 114 may also be connected to an external module (not shown) for receiving information related to yaw rate, lateral acceleration, longitudinal acceleration of the vehicle, or other characteristics of vehicle operation for any reason, such as, but not limited to, controlling the brake system 100 during vehicle braking, stability operation, or other modes of operation. Additionally, each ECU 114 may be connected to the instrument cluster for collecting and supplying information related to warning indicators such as an ABS warning light, a brake fluid level warning light, and a traction control/vehicle stability control indicator light.

In the brake system 100 configuration shown in FIG. 1, the first electronic control unit 114 controls the first power transmission unit 108A, and the second electronic control unit 114' controls the second power transmission unit 108B. When electric brakes are present, such as the rear brake motors 106A and 106C used with the rear wheel brakes as shown, each rear brake motor 106 may be controlled by a selected one of the first and second electronic control units 114 and 114' other than the first or second electronic control unit 114 or 114' that controls the rear wheel brake associated with the same respective rear wheel brake motor. Stated differently, when the first electronic control unit 114 controls the right rear wheel brake 102A as shown, then the second electronic control unit 114' will control the right rear brake motor 102A associated with that same right rear wheel brake. Likewise, when the second electronic control unit 114' controls the left rear wheel brake 102C as shown, then the first electronic control unit 114 will control the left rear brake motor 102C associated with that same left rear wheel brake. This use of different electronic control units 114 for the two different brakes associated with the same wheel may help provide some desired redundancy in the system, in case of the failure of one of the electronic control units 114.

As shown schematically in FIG. 1, the brake pedal unit 104 includes a deceleration signal transmitter 115 with a housing 116 for slidably receiving various cylindrical pistons and other components therein. Note that the housing is not specifically schematically shown in the Figures, but instead the walls of the longitudinally extending bore are schematically illustrated. The housing 116 may be formed as a single unit or include two or more separately formed portions coupled together. A piston 404 is connected with a brake pedal 120 via a linkage arm 122. Leftward movement of the piston 404 may cause, under certain conditions, a pressure increase within the deceleration signal transmitter 115. The deceleration signal transmitter 115 is operable by actuation of a brake pedal 120 (by the driver) connected to the deceleration signal transmitter 115 to generate a brake actuating signal, for example, at a first output 124 via the travel sensors T. In the brake system 100 shown in FIG. 1, the brake actuating signal may be generated hydraulically and/or electrically, such as by an electrically and/or magnetically sensed position of the piston 404 due to brake pedal 120 travel.

A pedal simulator function may be provided to the deceleration signal transmitter 115 for providing predetermined brake pedal response. Additionally, the deceleration signal transmitter 115 may be in fluid communication with a damping orifice 125 via the output 124, as shown schematically in FIG. 1. The piston 404 is slidably disposed in the bore of the housing 116 of the deceleration signal transmitter 115. The structures of the deceleration signal transmitter 115 permit fluid communication between the bore of the housing 116 and the reservoir 110 via a reservoir conduit 128. The deceleration signal transmitter 115 can provide predetermined brake pedal 120 response to the driver (e.g., brake pedal "feel"). In the brake system 100 shown in FIG. 1, the springs included in the deceleration signal transmitter 115 provide progressive force feedback (for the desired brake pedal 120 response/feel during pedal apply and pedal release in some use configurations. The damping orifice 125 of FIG. 1 is hydraulically interposed between the deceleration signal transmitter 115 and the reservoir 110—e.g., by virtue of its position along the reservoir conduit 128. (The damping orifice 125 may be bypassed during pedal release.) The deceleration signal transmitter 115 does not provide a manual "push-through" feature to the brake system 100 in the FIG. 1 configuration.

The brake system 100 may further include first and second control valves 130A and 130B, respectively. Each control valve 130A or 130B is located hydraulically interposed between a corresponding first or second power transmission unit 108A and 108B and the reservoir 110. It is also contemplated that the first and second control valves 130A and 130B may be actuated to allow the corresponding first or second power transmission unit 108A or 108B to build up pressure in the "lower" portion of the corresponding first or second brake pressure circuit (i.e., between the power transmission unit 108 and the wheel brake(s) 102 actuated thereby) to assist with brake application as desired.

The brake pedal unit 104 is connected to the brake pedal 120 and is actuated by the driver of the vehicle as the driver presses on the brake pedal 120. A brake sensor or switch 134 may be electrically connected to at least one of the electronic control units 114 to provide a signal indicating a depression of the brake pedal 120. If the deceleration signal transmitter 115 is hydraulically connected to other portions of the brake system 100, the brake pedal unit 104 can supply pressurized fluid to the first output 124, which is then routed to the hydraulically operated ones of the wheel brakes 102A, 102B, 102C, and 102D as desired. It is contemplated that the brake system 100 could include at least two hydraulically operated wheel brakes 102A, 102B, 102C, and 102D. For example, the two front wheel brakes 102B and 102D, the two rear wheel brakes 102A and 102C, or either front wheel brake 102B or 102D and one rear wheel brake 102A or 102C, could constitute a "pair" of hydraulically operated wheel brakes 102A, 102B, 102C, and 102D. In the below description, a pair of front wheel brakes 102B and 102D are used as an example, though one of ordinary skill in the art will be able to provide a suitable brake system 100 according to aspects of the present invention for any combination of two or more hydraulically-operated wheel brakes 102A, 102B, 102C, and 102D.

Multiplex control of each of the pair of front wheel brakes 102B and 102D may be provided by an arrangement of first and second parallel valves 142 and 144, respectively, for each wheel brake. The first and second parallel valves 142 and 144 could be, for example, of the isolation valve type. The first and second parallel valves 142 and 144 could be substantially similar in configuration to each other, or could include some differences. One of ordinary skill in the art will readily be able to provide suitable first and second parallel valves 142 and 144 for a desired use environment of the present invention.

Here, for clarity in some Figures, the first and second parallel valves 142 and 144 are appended with the letters "A", "B", "C", or "D", referencing a respective front wheel brake 102B and 102D or rear wheel brake 102A and 102C, with which the so-labeled valves are respectively associated. A chosen one of the first and second parallel valves 142 and 144 receives input from an output of the other one of the first and second parallel valves 142 and 144. The first and second parallel valves 142 and 144 for selected front and rear wheel brakes 102A/102B or 102C/102D can be actuated by the first power transmission unit 108A, and the first and second parallel valves 142 and 144 for the other front and rear wheel brakes 102C/102D or 102A/102B can be actuated by the second power transmission unit 108B, as shown in FIG. 1. Together, the first and second parallel valves 142 and 144, when used in the "reverse plumbed" fashion shown in the Figures to provide multiplex control of the front brakes, will be referenced as a multiplex valve arrangement 146 (again, with an appended "A", "B", "C", or "D", when associated with a particular one of the front wheel brakes 102B and 102D or a particular one of the rear wheel brakes 102A or 102C).

The multiplex control facilitated by the multiplex valve arrangement 146 selectively provides, for example, slip control or traction compensation to at least one of the pair of front wheel brakes 102B and 102D and the pair of rear wheel brakes 102A and 102C, corresponding to a selected arrangement of first and second parallel valves 142 and 144. Multiplex control of the front wheel brakes 102B and 102D and the rear wheel brakes 102A and 102C is provided by an arrangement of first and second parallel valves 142 and 144, with a chosen one of the first and second parallel valves 142 or 144 receiving input from the first or second power transmission unit 108A or 108B corresponding to the chosen wheel brake and output to a chosen one of the pair of front wheel brakes 102B or 102D and the pair of rear wheel brakes 102A or 102C, and the other of the first and second parallel valves 142 or 144 receiving input from the chosen one of the pair of front wheel brakes 102B or 102D and the pair of rear wheel brakes 102A or 102C and output to the first or second power transmission unit 108 A or 108 B corresponding to the chosen wheel brake. In this manner, the fluid pressures at each of the front wheel brakes 102B and 102D and the rear wheel brakes 102A and 102C can be controlled independently from one another even though the brake system 100—or at least or the corresponding first or second brake pressure circuit—may include a single source of pressure (e.g., first or second power transmission unit 108A or 108B).

Thus, the multiplex valve arrangement 146 downstream of the pressure source includes first and second parallel valves 142 and 144 which are controlled between their open and closed positions to provide different braking pressures within the front wheel brakes 102B and 102D or the rear wheel brakes 102B and 102C, as desired for a particular braking situation. The multiplex valve arrangement 146, and/or other valves of the brake system 100, any of which may be solenoid-operated and have any suitable configurations, can be used to help provide controlled braking operations, such as, but not limited to, ABS, traction control, vehicle stability control, dynamic rear proportioning, regenerative braking blending, and autonomous braking.

Figure 2:
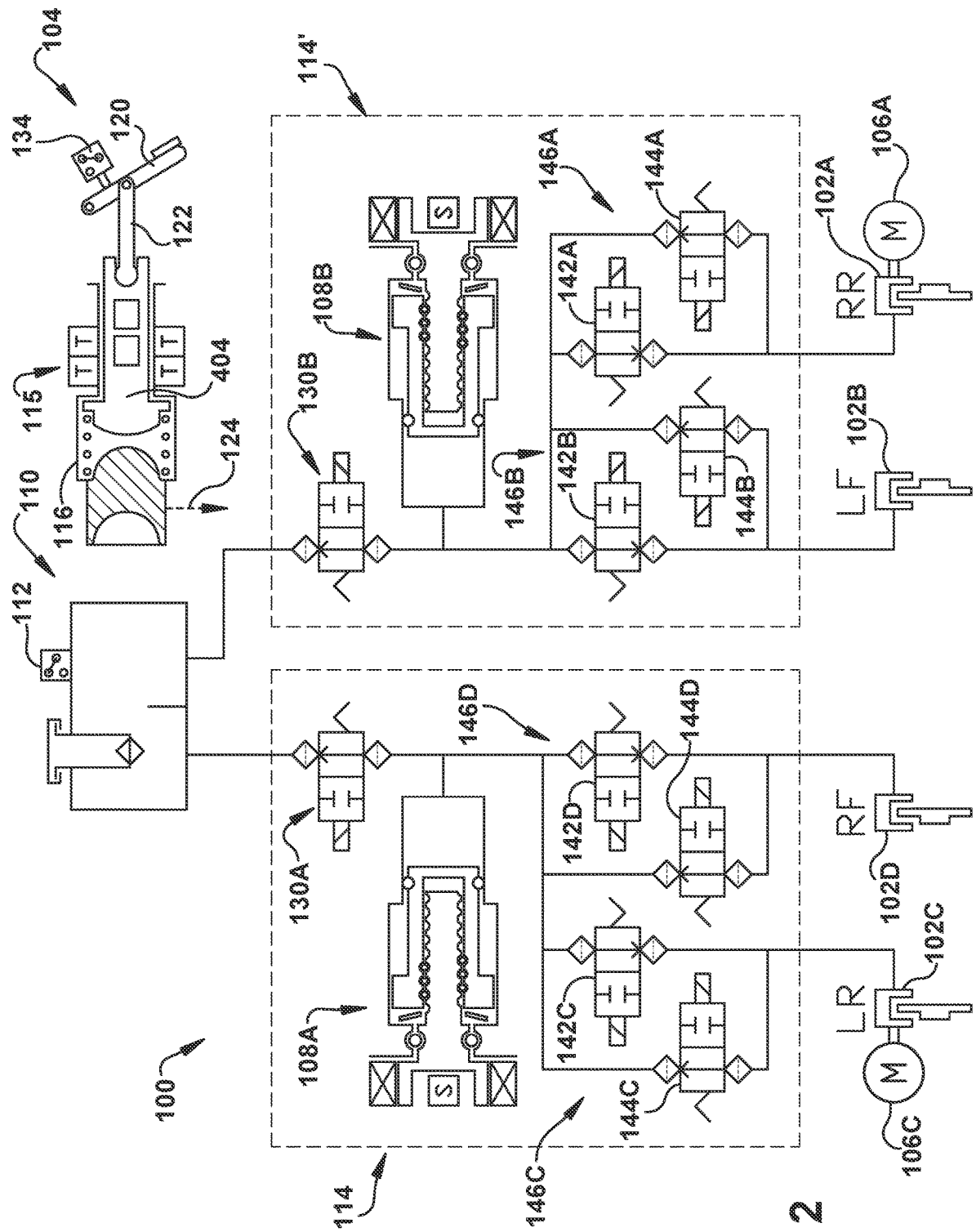
FIG. 2 is a schematic hydraulic diagram of the brake system of FIG. 1, in a second configuration.

With reference now to FIG. 2, a second configuration of the brake system 100 is depicted, parts or all of which can be used with other components of the present invention, as desired. Description of similar components and operation which is made elsewhere in this application will not necessarily be repeated for each and every described configuration or aspect of the brake system 100, for brevity, but should instead be considered to apply to like-numbered portions of other configurations as appropriate. In the arrangement of the brake system 100 shown in FIG. 2, the deceleration signal transmitter 115 and brake pedal 120 are hydraulically isolated from at least the reservoir 110 and the first and second power transmission units 108A and 108B. The brake actuating signal is conveyed to at least one of the first and second power transmission units 108A and 108B solely as an electronic signal. For example, an electronic signal may be provided by one or more travel sensors "T" and transmitted, via the first output 124 (as shown schematically in FIG. 2), to other portions of the brake system 100.

The first and second control valves 130A and 130B of the brake system 100 configuration of FIG. 2 are each selectively operable to substantially block fluid flow to and from the reservoir 110 and the corresponding first or second power transmission unit 108A and 108B. This blockage may be accomplished, for example, to facilitate retraction of a caliper of at least one of the wheel brakes actuated by the corresponding first or second power transmission unit for diagnostic purposes, such as monitoring of brake pad wear.

It is also contemplated, for example, that the deceleration signal transmitter 115, brake pedal 120 and related structures, and the pedal simulator 126 and related structures, could be omitted from the brake system 100 otherwise shown in FIG. 2, for a truly autonomous brake arrangement. Another autonomous braking scheme is shown and described in, for example, in patent application U.S. patent application Ser. No. 17/188.227, filed concurrently herewith and titled "Hydraulic Brake Boost", which is hereby incorporated by reference for all purposes.

Figure 3:
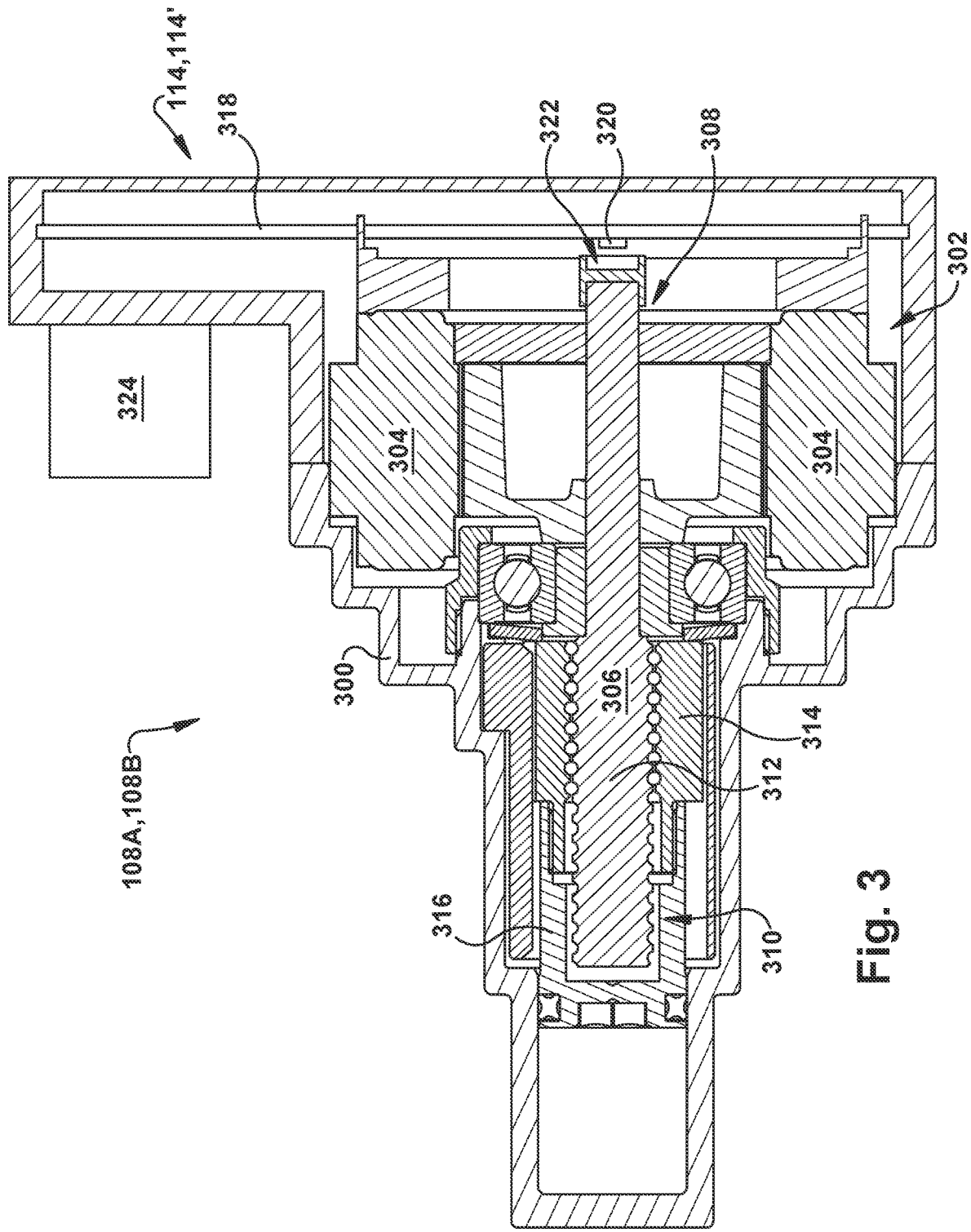
FIG. 3 is a schematic partial side view of a first component suitable for use in a brake system according to any aspect of the present invention.

The brake system 100 shown in FIG. 2 includes first and second power transmission units 108A and 108B which each include an integrated electronic control unit. That is, the first electronic control unit 114 is integrated into the first power transmission unit 108A, and the second electronic control unit 114 is integrated into the second power transmission unit 108B. FIG. 3 is a schematic depiction of an example of such an integrated structure.

FIGS. 3-6 are schematic depictions of certain components that could be used with various configurations of the brake system 100. It is contemplated that other components could be used with the brake system 100, as well. One example would be a pedal simulator valve similar to that shown and described in patent application U.S. patent application Ser. No. 17/188,152, filed concurrently herewith and titled "Simulator Valve", which is incorporated herein by reference in its entirety, for all purposes.

FIG. 3 depicts schematically a combination or integrated component whereby, for example, at least one of the first and second electronic control units 114 or 114' is integrated into a corresponding first or second power transmission units 108A or 108B. The at least one power transmission unit 108A or 108B shown in FIG. 3 therefore includes a PTU housing 300 which may be, for example, cast aluminum. It is contemplated that, for most use environments of the power transmission unit 108A, 108B shown in FIG. 3, the PTU housing 300 will completely enclose an interior space within.

An electric PTU motor 302 is located within and affixed to the PTU housing 300 such that the PTU housing 300 absorbs and/or dissipates torque developed by a stator 304 of the electric PTU motor 302. A longitudinally extending spindle 306 is located within the PTU housing 300 and is selectively rotationally driven by the electric PTU motor 302. The spindle 306 has first and second spindle ends 308 and 310, respectively, separated by a spindle body 312.

A ball nut 314 surrounds the spindle body 312 and is driven by rotation of the spindle 306 for reciprocating longitudinal movement therealong. The ball nut 314 urges a plunger 316 adjacent the second spindle end 310 for longitudinal reciprocation within the PTU housing 300, in order to pressurize fluid located to the left (in the orientation of FIG. 3) of the plunger 316 for provision to other hydraulically driven components of the brake system 100. The design shown for the power transmission unit 108A, 108B of FIG. 3 may be a relatively low inertia design, compared to prior art power transmission units, at least in part due to the interaction between the spindle 306 and the ball nut 314. Combined with the multiplex valve arrangement 146 in certain configurations of the brake system 100, desirable spike apply response and slip control modulation properties could be achieved through use of the components shown and described herein.

A printed ECU circuit board 318 is located within the PTU housing 300 adjacent the first spindle end 308. The printed ECU circuit board 318 substantially carries out the functions in this integrated component that would normally be accomplished by a standalone electronic control unit 114, 114' in other configurations of the brake system 100. In the depicted power transmission unit 108A, 108B, the motor stator and sensor attach to the circuit board 318. As shown, the stator and sensor are fully integrated. In contrast, prior art stators and sensors are pre-assembled to the hydraulic unit of the power transmission unit 108A, 108B and then attach to the ECU 114, 114' via expensive and difficult to package electrical interconnection systems.

The printed ECU circuit board 318 includes a Hall effect sensor 320 for interaction with a magnet 322 carried by the first spindle end 308 to responsively determine a position of the first spindle end 308 relative to the Hall effect sensor 320. As a result, the integrated component of FIG. 3 can directly sense and responsively control the rotational position of the spindle 306 within the PTU housing 100 and thus the position of the plunger 316, through direct or indirect connection to the spindle 306, can be sensed and controlled as desired.

The printed ECU circuit board 318 can be connected to other components of the brake system 100 using connector 324, which may be a wired or wireless connector. Accordingly, the integrated power transmission unit 108A, 108B with electronic control unit 114, 114' depicted in FIG. 3 may help with efficiently providing a low-profile and/or limited-footprint combined device which could result in space and/or weight savings, for certain configurations of the brake system 100.

Figure 4:
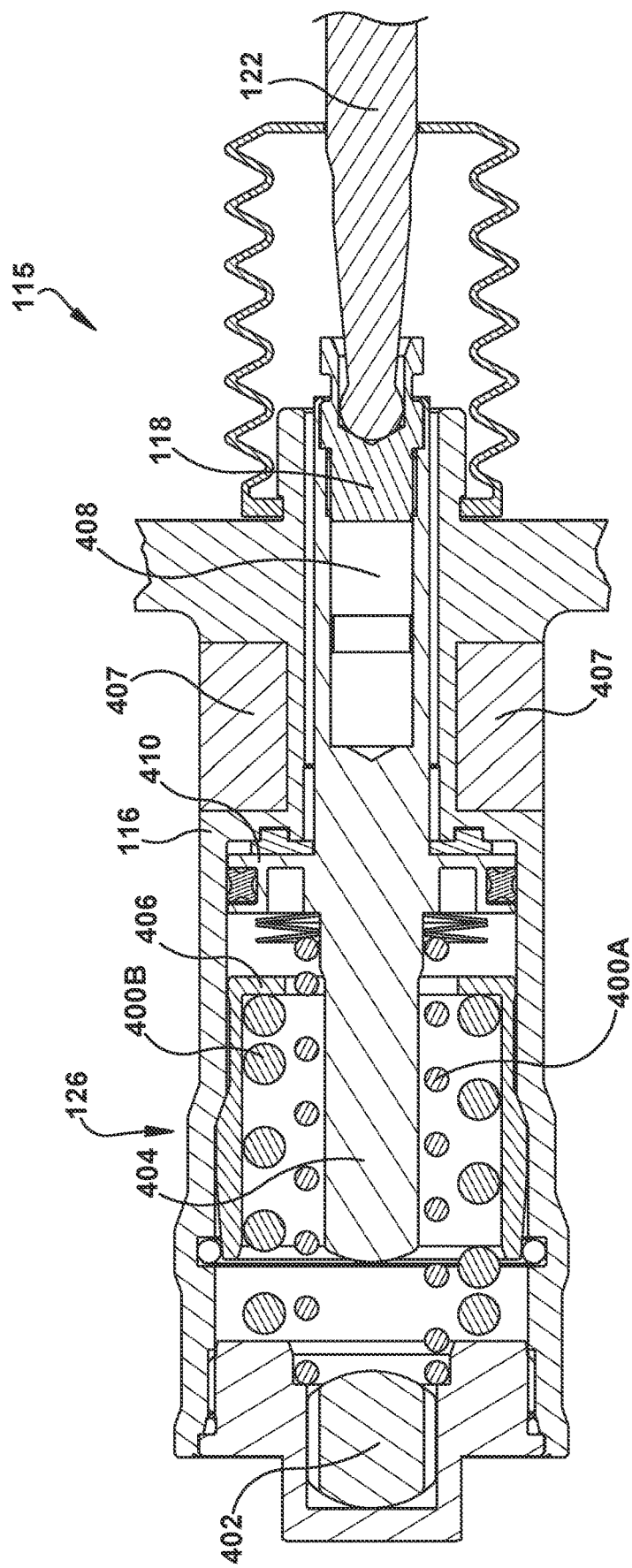
FIG. 4 is a schematic partial side view of a second component suitable for use in a brake system according to any aspect of the present invention.

With reference now to FIG. 4, a pedal simulator (shown schematically at 126) is integrated into the deceleration signal transmitter 115 by being at least partially enclosed within the housing 116 of the deceleration signal transmitter 115 to create a "wet" integrated pedal simulator 126. The integrated pedal simulator 126 is configured to provide a progressive force-versus-travel curve for the brake pedal 120 using a plurality of force-response springs, having any desired similar or different spring forces, with two different coil-type force-response springs 400A and 400B being shown and described herein with respect to the pedal simulator 126. As shown in FIG. 4, the integrated pedal simulator may include a resilient stop 402 against which a rounded-end piston 404 presses to cushion impact of the piston 404 during operation of the pedal simulator 126 portion of the deceleration signal transmitter 115. The piston 404 is directly connected to the linkage arm 122 via the retainer 118. A spring retainer 406 limits the compression of both coil-type force-response springs 400A, 400B and provides progressive force hysteresis, as shown. At least one travel sensor 407 detects movement of magnets 408 to responsively produce a signal indicative of a longitudinal position of the piston 404 within the housing 116. As shown in FIG. 4, the magnets 408 are housed within the piston 404 to prevent their rotation and protect them from damage. A relatively large diameter flange 410 of the piston 404 causes low damping pressures within the pedal simulator 126 portion of the component, which, in turn, allows for relatively large damping orifices (as compared to the prior art), which are less likely to plug than in prior art devices.

In use, the driver pushes the brake pedal 120, which forces the linkage arm 122 toward the left, in the orientation of FIG. 4. The lower-resistance force-response spring 400A resists the pushing force until it is compressed to the point that the piston 404 directly or indirectly (e.g., via intervening disc springs as shown in FIG. 4) contacts the rightmost (in the orientation of FIG. 4) surface of the spring retainer 406. Once such contact is made, the spring retainer 406 moves in concert with the linkage arm 118 to further compress the higher-resistance force-response spring 400B within the housing 116 under maintained compressive force. In this manner, the integrated pedal simulator 126 provides a comfortable and expected "feel" to the brake pedal 120 for the driver. Should compressive force be maintained by the driver until the curved head of the piston 404 comes into contact with the resilient stop 402, that curved or spherical surface helps to spread the compressive force against the resilient stop 402, as well as avoid a jarring, sudden contact with the resilient stop 402 that a driver would likely find unpleasant and to mimic the feeling of vacuum booster runout.

Figure 5:
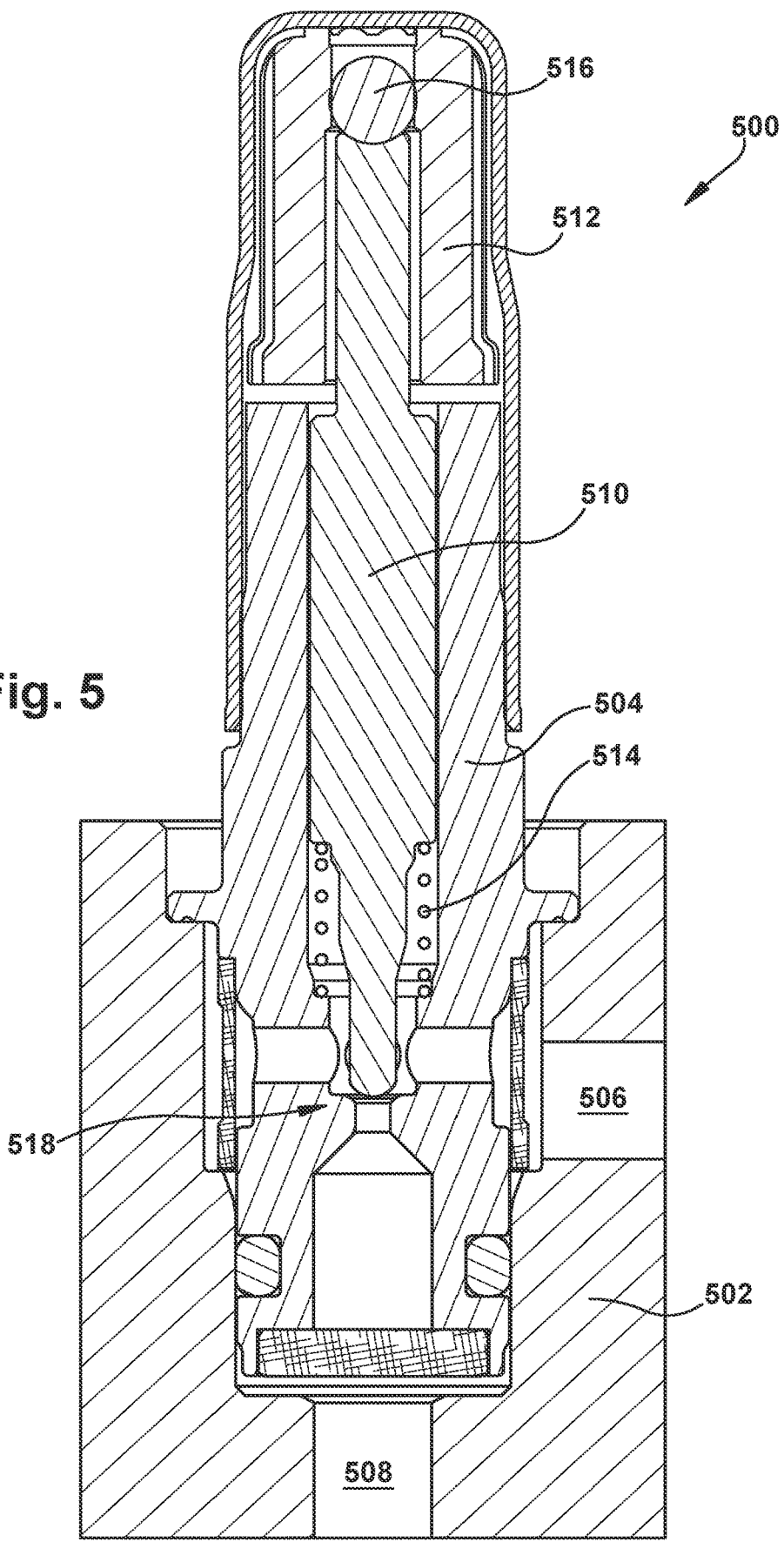
FIG. 5 is a schematic partial side view of a third component suitable for use in a brake system according to any aspect of the present invention.

FIG. 5 schematically depicts an isolation valve 500, which may be either of the first and second parallel valves 142 and 144. A housing 502 carries a body 504. The housing 504 includes a first passage 506, for fluid communication with deceleration signal transmitter the power transmission unit 108) and a respective wheel brake 102A, 102B, 102C, or 102D, and a second passage 508 facilitates fluid communication with the other one of the pressure source and the respective wheel brake. A tappet 510 longitudinally reciprocates within the body 504 under influence from an armature 512, which may be solenoid-driven. The "longitudinal" direction is substantially vertical, in the orientation of FIG. 5. A valve spring 514 biases the tappet 510 upward, in the orientation of FIG. 5, and into engagement with a ball 516 carried by the armature 512. As a result, the tappet 508 is biased by the valve spring 514 away from a seat 518, and therefore the isolation valve 500 of FIG. 5 will tend to be open when deenergized.

Figure 6:
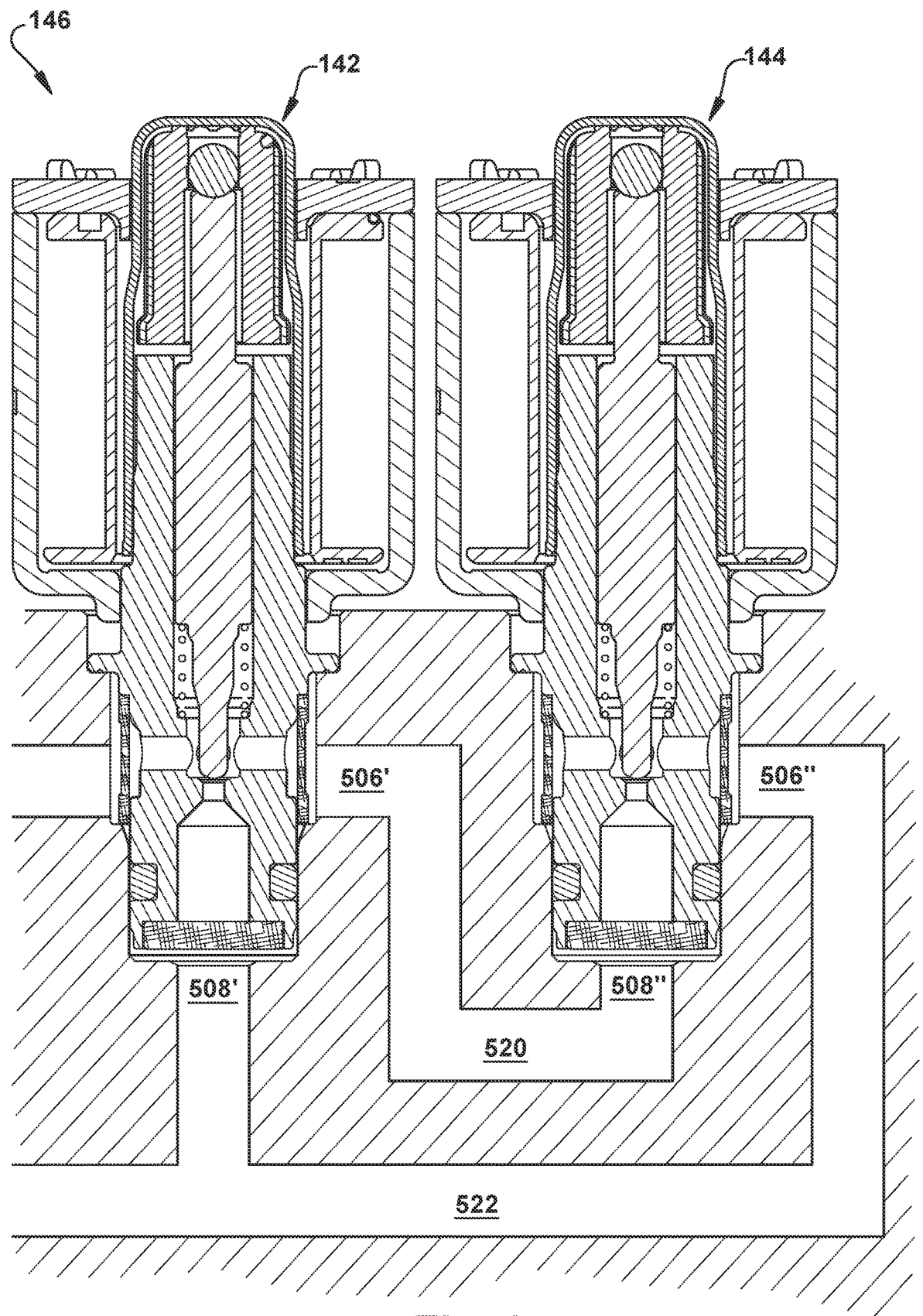
FIG. 6 is a schematic partial side view of a fourth component suitable for use in a brake system according to any aspect of the present invention.

An arrangement of two isolation valves 500, each substantially similar to that shown in FIG. 5, is shown schematically in FIG. 6. In FIG. 6, the isolation valves are described as being first and second parallel valves 142 and 144, assembled into a multiplex valve arrangement 146. The first and second parallel valves 142 and 144 are each generally operable to two positions, as schematically shown in the Figures.

Prior art multiplex valves tend to be of either a "pressure balanced" or a "brute-force" type. These prior art valves tend to be expensive to manufacture (requiring specialty parts that are not used in other, similar valves of the system), and may require undesirably high current for proper operation of a single valve. In contrast, the multiplex valve arrangement 146 depicted schematically in FIG. 6 includes two valves, each with their own coil for operation. Pressure is equalized across first and second parallel valves 142 and 144, and the total current draw needed to power the solenoids of these two valves is lower than the current draw needed for the unitary multiplex valves taught by the prior art. In addition, due to the modular nature of the multiplex valve arrangement 146, the first and second parallel valves 142 and 144 according to aspects of the present invention can be replaced singly, for cost and time savings, rather than requiring that an entire single-piece multiplex valve the replaced upon malfunction.

The first and second parallel valves 142 and 144 are "reverse plumbed" into the multiplex valve arrangement 146 shown in FIG. 6. That is, a chosen one of the first and second parallel valves 142 or 144 receives input from an output of the other one of the first and second parallel valves 142 or 144. This configuration is depicted schematically in FIG. 6 by use of the first multiplex passage 520 (connecting first passage 506' of first parallel valve 142 with second passage 508" of second parallel valve 144) and the second multiplex passage 522 (connecting first passage 506" of second parallel valve 144 with second passage 508' of first parallel valve 142). In this way, one of the valves will always open when de-energized if a pressure differential exists across the first and second parallel valves 142 and 144. This is true even if a relatively low force spring is used in the first and second parallel valves 142 and 144. After a chosen one of the first and second parallel valves 142 and 144 opens, the other one of the first and second parallel valves 142 and 144 will open if the pressure differential across the valve is allowed to drop below a certain amount based on plunger control. This presumes that the coils of both of the first and second parallel valves 142 and 144 are controlled substantially similarly.

It is contemplated that separate control of the coils can instead be used, in some use environments. For example, the plunger could be controlled to a pressure greater than brake pressure with both of the first and second parallel valves 142 and 144 energized closed. The selected one of the first and second parallel valves 142 and 144 which oriented such that pressure is trying to keep the valve closed can remain energized while the other one of the first and second parallel valves 142 and 144 can be momentarily de-energized such that the pressure may not equalize across the first and second parallel valves 142 and 144 as fluid is applied to the brake. This type of control is also possible with common valve control if the pressure across the selected one of the first and second parallel valves 142 and 144 with pressure trying to keep it closed is not allowed to drop below a certain amount, based on its sealing diameter, spring force, any flow forces on the tappet, or any other desired factors.

Figure 7:
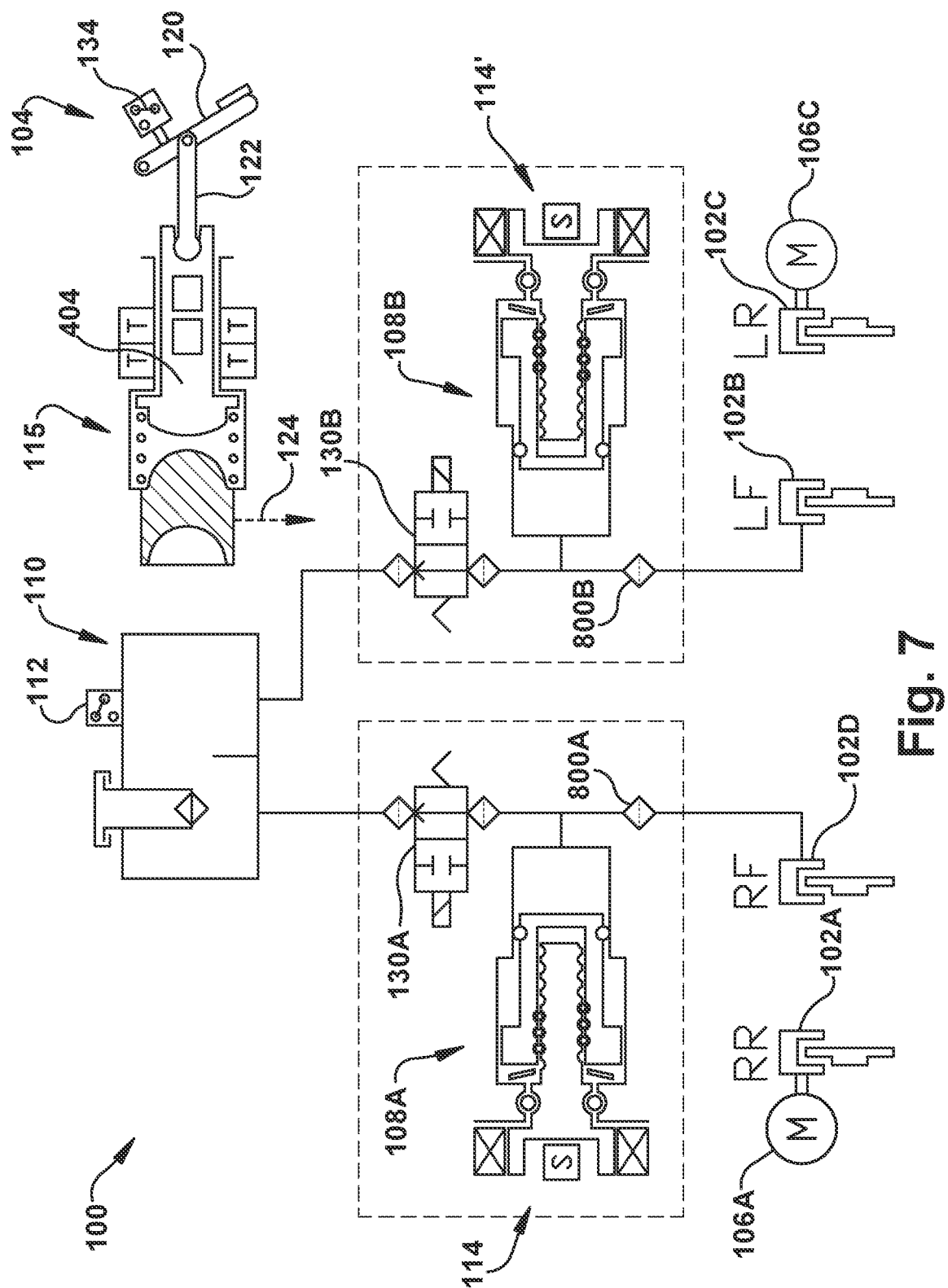
FIG. 7 is a schematic hydraulic diagram of the brake system of FIG. 1, in a third configuration.

FIG. 7 depicts a brake system 100 having a deceleration signal transmitter 115 and brake pedal 120 hydraulically isolated from at least the reservoir 110 and first and second power transmission units 108A and 108B of the depicted brake system 100. The brake system 100 of FIG. 7 is of the "diagonal split" type, wherein the first brake pressure circuit provides hydraulic power and control to the right front wheel brake 102D, and electric power and control to the left rear wheel brake 102C (which is of a wholly electric type). Likewise, the second brake pressure circuit provides hydraulic power and control to the left front wheel brake 102B and electric power and control to the right rear wheel brake 102A. Stated differently, each rear brake motor 106A, 106C is controlled by a corresponding one of the first and second electronic control units 108A, 108B that controls the contralateral front wheel brake 102B, 102D. It should be noted that, whenever a wheel brake 102 is shown or described herein as being only electrically powered, or as not having a hydraulic connection to other hydraulic components of the brake system 100, that wheel brake 102 will be of an electro-mechanical type, whether or not an electrical brake (not shown) is provided to any other wheels of the same brake system 100.

In the brake system 100 shown in the third configuration of FIG. 7, each power transmission unit 108A and 108B includes an integrated respective electronic control unit 114, 114'. A control valve 130A, 130B is provided, as previously discussed, to each of the first and second brake pressure circuits. It is contemplated that the first power transmission unit 108A (incorporating the first electronic control unit 114) and the first control valve 130A may be packaged together, and spaced apart from, the second power transmission unit 108B (incorporating the second electronic control unit 114') and the second diagnostic valve 130B—which may, likewise, be packaged together. This differential placement may be provided for any reason, such as, but not limited to, space or weight savings, packaging flexibility, and ease of manufacture.

A single acting plunger ("SAP") filter 800A, 800B may be interposed hydraulically between each of the first and second power transmission units 108A, 108B, respectively, and a corresponding front wheel brake 120D, 102B.

Figure 8:
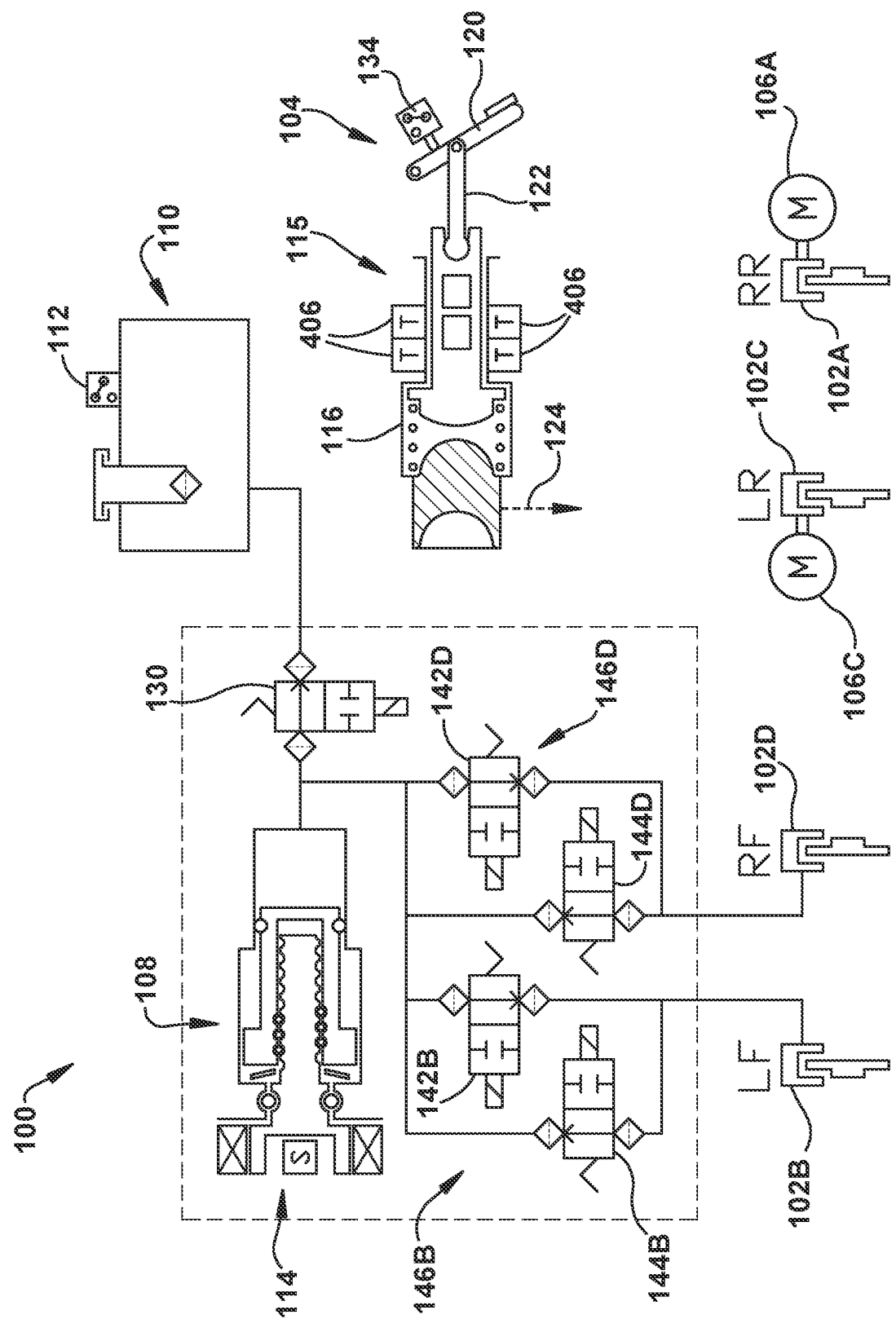
FIG. 8 is a schematic hydraulic diagram of the brake system of FIG. 1 in a fourth configuration.

Turning now to the brake system 100 shown in a fourth configuration in FIG. 8, a single power transmission unit 108, having an integrated electronic control unit 114, is depicted, in a fifth configuration. This is a "vertical split" arrangement, which includes components similar to those previously described and shown in any of FIGS. 1-7. Here, the brake pedal 120 and deceleration signal transmitter 115 are hydraulically isolated from at least the reservoir 110 and the power transmission unit 108, with the brake actuating signal being conveyed to the power transmission unit 108 solely as an electronic signal from the two redundant pedal travel sensors T, such as by being transmitted via the first output (shown schematically at 124). The brake system 100 shown in FIG. 8 includes multiplex valve arrangements 146 B and 146 D, as previously described. A control valve 130 is located hydraulically between the reservoir 110 and the power transmission unit 108.

In the brake system 100 shown in FIG. 8, then, the single acting plunger type power transmission unit 108 hydraulically actuates the front wheel brakes 102B, 102D with multiplex slip control facilitated by the multiplex valve arrangements 146B and 146D. In the "standalone" brake pedal unit 104 and deceleration signal transmitter 115 arrangement shown, for example, in FIG. 8, the deceleration signal transmitter may be employed to recognize and/or transmit one or more operator signals, conveyed via interaction with the brake pedal 120, to the electronic control unit 114 and/or other components of the brake system 100.

It is contemplated that components, arrangements, or any other aspects of the brake system 100 shown and described herein could also or instead be used in the brake systems shown and depicted in patent applications U.S. patent application Ser. No. 17/188,363, filed concurrently herewith and titled "Apparatus and Method for Control of a Hydraulic Brake System", and/or U.S. patent application Ser. No. 17/188,227, filed concurrently herewith and titled "Hydraulic Brake Boost", both of which are hereby incorporated by reference in their entirety for all purposes.

It is contemplated that the wheel brakes 102A, 102B, 102C, and 102D could each be powered electrically and/or hydraulically—for example, the front wheel brakes 102B and 102D could be hydraulically powered and the rear wheel brakes 102A and 102C could be electrically powered, and/or at least one of the wheel brakes 102A, 102B, 102C, and 102D could be powered electrically during certain phases of operation and hydraulically during other phases of operation, of the same brake system 100. It is also contemplated that one or more hydraulically and/or electrically powered parking brakes (not shown) could be provided to any of the wheels of the vehicle, as desired.

As used herein, the singular forms "a", "an", and "the" can include the plural forms as well, unless the context clearly indicates otherwise. It will be further understood that the terms "comprises" and/or "comprising", as used herein, can specify the presence of stated features, steps, operations, elements, and/or components, but do not preclude the presence or addition of one or more other features, steps, operations, elements, components, and/or groups thereof.

As used herein, the term "and/or" can include any and all combinations of one or more of the associated listed items.

It will be understood that when an element is referred to as being "on", "attached" to, "connected" to, "coupled" with, "contacting", "adjacent", etc., another element, it can be directly on, attached to, connected to, coupled with, contacting, or adjacent the other element, or intervening elements may also be present. In contrast, when an element is referred to as being, for example, "directly on", "directly attached" to, "directly connected" to, "directly coupled" with, "directly contacting", or "directly adjacent" another element, there are no intervening elements present. It will also be appreciated by those of ordinary skill in the art that references to a structure or feature that is disposed "directly adjacent" another feature may have portions that overlap or underlie the adjacent feature, whereas a structure or feature that is disposed "adjacent" another feature might not have portions that overlap or underlie the adjacent feature.

Spatially relative terms, such as "under", "below", "lower", "over", "upper", "proximal", "distal", "left", "right", and the like, may be used herein for ease of description to describe one element or feature's relationship to another element(s) or feature(s) as illustrated in the figures. It will be understood that the spatially relative terms can encompass different orientations of a device in use or operation, in addition to the orientation depicted in the figures. For example, if a device in the figures is inverted, elements described as "under" or "beneath" other elements or features would then be oriented "over" the other elements or features.

As used herein, the phrase "at least one of X and Y" can be interpreted to include X, Y, or a combination of X and Y. For example, if an element is described as having at least one of X and Y, the element may, at a particular time, include X, Y, or a combination of X and Y, the selection of which could vary from time to time. In contrast, the phrase "at least one of X" can be interpreted to include one or more Xs.

It will be understood that, although the terms "first", "second", etc. may be used herein to describe various elements, these elements should not be limited by these terms. These terms are only used to distinguish one element from another. Thus, a "first" element discussed below could also be termed a "second" element without departing from the teachings of the present disclosure. The sequence of operations (or steps) is not limited to the order presented in the claims or figures unless specifically indicated otherwise.

While aspects of this disclosure have been particularly shown and described with reference to the example aspects above, it will be understood by those of ordinary skill in the art that various additional aspects may be contemplated. For example, the specific methods described above for using the apparatus are merely illustrative; one of ordinary skill in the art could readily determine any number of tools, sequences of steps, or other means/options for placing the above-described apparatus, or components thereof, into positions substantively similar to those shown and described herein. In an effort to maintain clarity in the Figures, certain ones of duplicative components shown have not been specifically numbered, but one of ordinary skill in the art will realize, based upon the components that were numbered, the element numbers which should be associated with the unnumbered components; no differentiation between similar components is intended or implied solely by the presence or absence of an element number in the Figures. Any of the described structures and components could be integrally formed as a single unitary or monolithic piece or made up of separate sub-components, with either of these formations involving any suitable stock or bespoke components and/or any suitable material or combinations of materials. Any of the described structures and components could be disposable or reusable as desired for a particular use environment. Any component could be provided with a user-perceptible marking to indicate a material, configuration, at least one dimension, or the like pertaining to that component, the user-perceptible marking potentially aiding a user in selecting one component from an array of similar components for a particular use environment. A "predetermined" status may be determined at any time before the structures being manipulated actually reach that status, the "predetermination" being made as late as immediately before the structure achieves the predetermined status. The term "substantially" is used herein to indicate a quality that is largely, but not necessarily wholly, that which is specified—a "substantial" quality admits of the potential for some relatively minor inclusion of a non-quality item. Though certain components described herein are shown as having specific geometric shapes, all structures of this disclosure may have any suitable shapes, sizes, configurations, relative relationships, cross-sectional areas, or any other physical characteristics as desirable for a particular application. Any structures or features described with reference to one aspect or configuration could be provided, singly or in combination with other structures or features, to any other aspect or configuration, as it would be impractical to describe each of the aspects and configurations discussed herein as having all of the options discussed with respect to all of the other aspects and configurations. A device or method incorporating any of these features should be understood to fall under the scope of this disclosure as determined based upon the claims below and any equivalents thereof.

Other aspects, objects, and advantages can be obtained from a study of the drawings, the disclosure, and the appended claims.

I claim:

1. A brake system for actuating a pair of front wheel brakes and a pair of rear wheel brakes, the system comprising:
    a reservoir;
    a deceleration signal transmitter operable by actuation of a brake pedal connected to the deceleration signal transmitter to generate a brake actuating signal at a first output;
    first and second power transmission units configured for selectively providing pressurized hydraulic fluid for actuating the pair of front wheel brakes and the pair of rear wheel brakes during a braking event, the first power transmission unit actuating a selected one of the front wheel brakes and a selected one of the rear wheel brakes, and the second power transmission unit actuating the other one of the front wheel brakes and the other one of the rear wheel brakes;

first and second electronic control units for controlling the first and second power transmission units, respectively; and a pair of rear brake motors for selectively electrically actuating respective rear wheel brakes, each rear brake motor being controlled by a selected one of the first and second electronic control units other than the first or second electronic control unit that controls the rear wheel brake associated with the same respective rear wheel brake;

wherein control of each of the pair of front wheel brakes and the pair of rear wheel brakes is provided by an arrangement of first and second parallel valves for each wheel brake, with a chosen one of the first and second parallel valves receiving input from an output of the other one of the first and second parallel valves such that one of the first and second parallel valves opens when de-energized in response to a pressure differential across the first and second parallel valves, with the first and second parallel valves for the selected front and rear wheel brakes being actuated by the first power transmission unit and the first and second parallel valves for the other front and rear wheel brakes being actuated by the second power transmission unit.

2. The brake system of claim 1, wherein the first and second parallel valves have the same arrangement with each other for each wheel brake.

3. The brake system of claim 1, wherein the control selectively provides slip control to each wheel brake corresponding to a selected arrangement of first and second parallel valves.

4. The brake system of claim 1, wherein the control of each chosen wheel brake is provided by the arrangement of first and second parallel valves, with a chosen one of the first and second parallel valves receiving input from a first or second power transmission unit corresponding to the chosen wheel brake and output to the chosen wheel brake, and the other of the first and second parallel valves receiving input from the chosen wheel brake and output to the first or second power transmission unit corresponding to the chosen wheel brake.

5. The brake system of claim 1, wherein the brake pedal and deceleration signal transmitter are hydraulically isolated from at least the reservoir and first and second power transmission units, and the brake actuating signal is conveyed to at least one of the first and second power transmission units solely as an electronic signal from the first output.

6. The brake system of claim 1, including a damping orifice providing hydraulic damping and hydraulically interposed between the deceleration signal transmitter and the reservoir without providing a manual push through feature.

7. The brake system of claim 1, including first and second control valves, each control valve located hydraulically interposed between a corresponding first or second power transmission unit and the reservoir.

8. The brake system of claim 7, wherein the first and second control valves each are selectively operable to substantially block fluid flow to and from the reservoir and the corresponding first or second power transmission unit to facilitate retraction of a caliper of at least one of the wheel brakes actuated by the corresponding first or second power transmission unit for diagnostic purposes.

9. The brake system of claim 1, wherein at least one of the first and second electronic control units is integrated into a corresponding first or second power transmission units, the at least one power transmission unit including a PTU housing, an electric PTU motor located within and affixed to the PTU housing such that the PTU housing absorbs torque developed by a stator of the electric PTU motor, a longitudinally extending spindle located within the PTU housing and being selectively rotationally driven by the electric PTU motor, the spindle having first and second spindle ends separated by a spindle body, a ball nut surrounding the spindle body and being driven by rotation of the spindle for reciprocating longitudinal movement therealong, the ball nut urging a plunger adjacent the second spindle end for longitudinal reciprocation within the PTU housing, and a printed ECU circuit board located within the PTU housing adjacent the first spindle end, the printed ECU circuit board including a Hall effect sensor for interaction with a magnet carried by the first spindle end to responsively determine a position of the first spindle end relative to the Hall effect sensor.

10. The brake system of claim 1, wherein the first power transmission unit and the first control valve are packaged together, and spaced apart from, the second power transmission unit and the second control valve.

11. The brake system of claim 1, wherein the chosen one of the first and second parallel valves receives input from the output of the other one of the first and second parallel valves through a passage fluidly isolated from the wheel brake.

* * * * *